US007939914B2

(12) United States Patent
Bernstein et al.

(10) Patent No.: US 7,939,914 B2
(45) Date of Patent: May 10, 2011

(54) DUAL WIRED INTEGRATED CIRCUIT CHIPS

(75) Inventors: Kerry Bernstein, Underhill, VT (US);
Timothy Joseph Dalton, Ridgefield, CT (US); Jeffrey Peter Gambino, Westford, VT (US); Mark David Jaffe, Shelburne, VT (US); Paul David Kartschoke, Williston, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/029,589

(22) Filed: Feb. 12, 2008

(65) Prior Publication Data

US 2008/0128812 A1 Jun. 5, 2008

Related U.S. Application Data

(62) Division of application No. 11/774,853, filed on Jul. 9, 2007, now Pat. No. 7,381,627, which is a division of application No. 11/383,563, filed on May 16, 2006, now Pat. No. 7,285,477.

(51) Int. Cl.
*H01L 29/40* (2006.01)
*H01L 21/02* (2006.01)
*H01L 29/06* (2006.01)
*H01L 23/48* (2006.01)
*H01L 23/52* (2006.01)
*H01L 21/331* (2006.01)
*H01L 21/302* (2006.01)

(52) U.S. Cl. ........ 257/621; 257/382; 257/532; 257/618; 257/774; 438/355; 438/667

(58) Field of Classification Search .................. 257/532, 257/621, 758, 618; 438/455
See application file for complete search history.

(56) References Cited

U.S. PATENT DOCUMENTS 3,864,755 A 2/1975 Hargis
5,589,419 A 12/1996 Ochiai
5,918,130 A 6/1999 Hause et al.
(Continued)

FOREIGN PATENT DOCUMENTS

JP 05267563 10/1993
(Continued)

OTHER PUBLICATIONS

Ichimori, Takashi; Hirashita, Norio, in "Fully-Depleted SOI CMOSFETs With the Fully-Silicided Source/Drain Structure," Dec. 12, 2002, IEEE Transactions on Electron Devices, vol. 49, No. 12, 2296-2300.*

(Continued)

*Primary Examiner* — N Drew Richards
*Assistant Examiner* — Michael Jung
(74) *Attorney, Agent, or Firm* — Schmeiser, Olsen & Watts; Richard M. Kotulak

(57) ABSTRACT

A semiconductor device having wiring levels on opposite sides and a method of fabricating a semiconductor structure having contacts to devices and wiring levels on opposite sides. The method including fabricating a device on a silicon-on-insulator substrate with first contacts to the devices and wiring levels on a first side to the first contacts, removing a lower silicon layer to expose the buried oxide layer, forming second contacts to the devices through the buried oxide layer and forming wiring levels over the buried oxide layer to the second contacts.

31 Claims, 14 Drawing Sheets

U.S. PATENT DOCUMENTS

| | | | |
|---|---|---|---|
| 5,927,993 | A | 7/1999 | Lesk et al. |
| 6,376,351 | B1 * | 4/2002 | Tsai ................................ 438/592 |
| 6,392,290 | B1 | 5/2002 | Kasem et al. |
| 6,429,509 | B1 | 8/2002 | Hsuan |
| 6,562,647 | B2 | 5/2003 | Zandman et al. |
| 6,562,718 | B1 * | 5/2003 | Xiang et al. ................... 438/682 |
| 6,583,030 | B1 | 6/2003 | Grassl |
| 6,627,953 | B1 | 9/2003 | Vu et al. |
| 6,921,712 | B2 | 7/2005 | Soininen et al. |
| 6,921,961 | B2 * | 7/2005 | Sanchez et al. ............... 257/532 |
| 7,375,389 | B2 * | 5/2008 | Oh et al. ........................ 257/296 |
| 2003/0203546 | A1 | 10/2003 | Burbach et al. |
| 2004/0145058 | A1 | 7/2004 | Marty et al. |
| 2004/0150013 | A1 | 8/2004 | Ipposhi |
| 2004/0183204 | A1 * | 9/2004 | Cave et al. .................... 257/774 |
| 2004/0266159 | A1 | 12/2004 | Gardecki et al. |
| 2005/0042867 | A1 * | 2/2005 | Sanchez et al. ............... 438/684 |
| 2005/0044521 | A1 | 2/2005 | Swope |
| 2005/0056881 | A1 * | 3/2005 | Yeo et al. ...................... 257/315 |
| 2005/0156238 | A1 * | 7/2005 | Wen et al. ..................... 257/347 |
| 2005/0167782 | A1 | 8/2005 | Sanchez et al. |
| 2006/0095872 | A1 | 5/2006 | McElvain et al. |
| 2007/0236986 | A1 | 10/2007 | Fifield et al. |
| 2007/0245271 | A1 | 10/2007 | Feng et al. |

FOREIGN PATENT DOCUMENTS

| | | |
|---|---|---|
| JP | 06275803 | 9/1994 |
| WO | WO94/17553 | 8/1994 |
| WO | WO02/19421 A1 | 3/2002 |

OTHER PUBLICATIONS

Office Action (Mail Date Jan. 25, 2010) for U.S. Appl. No. 11/939,582, filed Nov. 14, 2007; Confirmation No. 6263.

H. Eggers, K. Hieber; Recent Development in Multilevel Interconnect Technology, May 1987, Component Division, Technology Center for Microelectronics, Siemens AG, Munich, W-Germany. 6 pages.

Office Action (Mail Date Jul. 7, 2010) for U.S. Appl. No. 11/939,582, filed Nov. 14, 2007; Confirmation No. 6263.

Office Action (Mail Date Oct. 5, 2010) for U.S. Appl. No. 11/939,582, filed Nov. 14, 2007; Confirmation No. 6263.

Office Action (Mail Date Oct. 7, 2010) for U.S. Appl. No. 12/029,575, filed Feb. 12, 2008; Confirmation No. 9118.

Nov. 29, 2010 filed Appeal Brief and Supplemental Amendment for U.S. Appl. No. 11/939,582, filed Nov. 14, 2007; Confirmation No. 6263.

* cited by examiner

DUAL WIRED INTEGRATED CIRCUIT CHIPS

This application in a division of copending U.S. application Ser. No. 11/774,853 filed on Jul. 9, 2007 which is a division of U.S. patent application Ser. No. 11/383,563 filed on May 16, 2006, now U.S. Pat. No. 7,285,477.

FIELD OF THE INVENTION

The present invention relates to the field of integrated circuits; more specifically, it relates to dual wired integrated circuit chips and methods of fabricating dual wired integrated circuit chips.

BACKGROUND OF THE INVENTION

As the density of integrated circuits increases the number of circuits increase. The increased circuit density results in smaller chip while the increased circuit count results in increased contact pads counts for connecting the integrated circuit to the next level of packaging. Therefore, there is an ongoing need for greater wiring density and increased contact pad count for connection of integrated circuit chips to the next level of packaging.

SUMMARY OF THE INVENTION

A first aspect of the present invention is a method of fabricating a semiconductor structure, comprising: forming one or more devices in a silicon-on-insulator substrate, the substrate comprising a buried oxide layer between an upper silicon layer and a lower silicon layer and a pre-metal dielectric layer on a top surface of the upper silicon layer; forming a first set of wiring levels over the pre-metal dielectric layer, each wiring level of the first set of wiring levels comprising electrically conductive wires in a corresponding dielectric layer, a lowermost wiring level in physical contact with a top surface of the pre-metal dielectric layer; removing the lower silicon layer from the substrate to expose a bottom surface of the buried oxide layer; forming electrically conductive first contacts to the devices, one or more of the first contacts extending from the top surface of the pre-metal dielectric layer to the devices, one or more wires of the lowermost wiring level of first set of wiring levels in electrical contact with the first contacts; forming electrically conductive second contacts to the devices, one or more of the second contacts extending from the bottom surface of the buried oxide layer to the devices; and forming a second set of wiring levels over the buried oxide layer, each wiring level of the second set of wiring levels comprising electrically conductive wires in a corresponding dielectric layer, a lowermost wiring level of the second set of wiring levels in physical contact with a top surface of the buried oxide layer, one or more wires of the lowermost wiring level of the second set of wiring levels in electrical contact with the second contacts.

A second aspect of the present invention is the first aspect wherein the devices include field effect transistors comprising source/drains formed in the upper silicon layer and gate electrodes formed over the upper silicon layer and separated from the upper silicon layer by a gate dielectric layer.

A third aspect of the present invention is the second aspect, wherein the forming the one or more devices includes forming an electrically conductive metal silicide layer on top surfaces of the source/drains and the gate electrodes.

A fourth aspect of the present invention is the third aspect, wherein at least one of the first contacts extends from the top surface of the pre-metal dielectric layer to the metal silicide layer on a corresponding gate electrode.

A fifth aspect of the present invention is the third aspect, wherein at least one of the first contacts extends from the top surface of the pre-metal dielectric layer to the metal silicide layer on a corresponding source/drain.

A sixth aspect of the present invention is the third aspect, further including: forming one or more silicon contact regions in the upper silicon layer and forming the metal silicide layer on top surfaces of the one or more silicon contact regions; and wherein at least one of the first contacts extends from the top surface of the pre-metal dielectric layer to the metal silicide layer on a corresponding silicon contact region of the one or more silicon contact regions, and wherein at least one of the second contacts extends from the bottom surface of the buried oxide layer through the upper silicon layer to the metal silicide layer on the corresponding silicon contact region.

A seventh aspect of the present invention is the third aspect, further including: forming a dielectric trench isolation in regions of the upper silicon layer, the trench isolation extending from the top surface of the upper silicon layer to the buried oxide layer; and wherein at least one of the first contacts extends from the top surface of the pre-metal dielectric layer to the trench isolation to physically and electrically contact a corresponding contact of the second contacts, the corresponding contact extending from the bottom surface of the buried oxide layer through the trench isolation.

An eighth aspect of the present invention is the third aspect, further including: forming one or more dummy gate electrodes in the pre-metal dielectric layer and forming the metal silicide layer on top surfaces of the one or more dummy gates; and forming one or more dummy gate electrodes in the pre-metal dielectric layer and wherein the forming the electrically conductive metal silicide layer also includes forming the metal silicide layer on top surfaces of the one or more dummy gates, wherein at least one of the second contacts extends from said bottom surface of the buried oxide layer through a trench isolation formed in the upper silicon layer, through a gate dielectric layer formed under the gate electrode to said metal silicide layer on the corresponding dummy gate electrode.

A ninth aspect of the present invention is the third aspect, forming one or more dummy gate electrodes in the pre-metal dielectric layer; and wherein the forming the electrically conductive metal silicide layer also includes forming the metal silicide layer on top surfaces of the one or more dummy gates, wherein at least one of the first contacts extends from the top surface of the pre-metal dielectric layer to the metal silicide layer of a corresponding dummy gate electrode of the one or more dummy gate electrodes, and wherein at least one of the second contacts extends from the bottom surface of the buried oxide layer through a trench isolation formed in the upper silicon layer, through a gate dielectric layer formed under the gate electrode to the dummy gate electrode.

A tenth aspect of the present invention is the third aspect, further including: forming an opening in the BOX layer over a corresponding source/drain to expose a bottom surface of the source/drain; depositing a metal layer in the opening on top of the bottom surface of the source/drain; forming a metal silicide region in the source/drain, the silicide region extending from the bottom surface of the source/drain to the silicide layer on the top surface of the source/drain region; and wherein at least on of the second contacts extends to and is in electrical contact with the metal silicide region.

A eleventh aspect of the present invention is the third aspect, wherein at least one of the second contacts extends from the bottom surface of the buried oxide layer through the upper silicon layer to the metal silicide layer on a corresponding source/drain.

A twelfth aspect of the present invention is the third aspect, wherein the metal silicide layer comprises platinum silicide, titanium silicide, cobalt silicide or nickel silicide.

A thirteenth aspect of the present invention is the second aspect, wherein the forming the one or more devices includes forming electrically conductive metal silicide regions of a metal silicide in the source/drains and electrically conductive metal silicide regions of the metal silicide in the gate electrodes, the metal silicide regions of the source/drains extending from top surfaces of the source/drains to bottom surfaces of the source drains and the metal silicide regions of the gate electrodes extending from top surfaces of the gate electrodes to bottom surfaces of the gate electrodes.

A fourteenth aspect of the present invention is the thirteenth aspect, wherein at least one of the first contacts extends from the top surface of the pre-metal dielectric layer to the metal silicide region of a corresponding gate electrode.

A fifteenth aspect of the present invention is the thirteenth aspect, wherein at least one of the first contacts extends from the top surface of the pre-metal dielectric layer to a corresponding metal silicide region of a corresponding source/drain.

This application in a division of U.S. application Ser. No. 11/774,853 filed on Jul. 9, 2007, now U.S. Pat. No. 7,381,627, which is a division of U.S. patent application Ser. No. 11/383,563 filed on May 16, 2006, now U.S. Pat. No. 7,285,477.

A seventeenth aspect of the present invention is the thirteenth aspect, further including: forming a dielectric trench isolation in regions of the upper silicon layer, the trench isolation extending from the top surface of the upper silicon layer to the buried oxide layer; and wherein at least one of the first contacts extends from the top surface of the pre-metal dielectric layer to the trench isolation to physically and electrically contact a corresponding contact of the second contacts, the corresponding contact extending from the bottom surface of the buried oxide layer through the trench isolation.

A eighteenth aspect of the present invention is the thirteenth aspect, further including: forming one or more dummy gate electrodes in the pre-metal dielectric layer and forming metal silicide regions of the metal silicide in the one or more dummy gates, the metal silicide regions extending from top surfaces of the one or more dummy gates to bottom surfaces of the one or more dummy gates; and wherein at least one of the first contacts extends from the top surface of the pre-metal dielectric layer to a metal silicide region of a corresponding dummy gate of the one or more dummy gate electrodes, and wherein at least one of the second contacts extends from the bottom surface of the buried oxide layer to the metal silicide region of the corresponding dummy gate electrode.

A nineteenth aspect of the present invention is the thirteenth aspect, wherein at least one of the second contacts extends from the bottom surface of the buried oxide layer to the metal silicide region of a corresponding source/drain.

A twentieth aspect of the present invention is the thirteenth aspect, wherein the metal silicide comprises platinum silicide, titanium silicide, cobalt silicide or nickel silicide A twenty-first aspect of the present invention is the first aspect, wherein each the corresponding dielectric layer of the first and second sets of wiring levels comprises a material independently selected from the group consisting of silicon dioxide, silicon nitride, silicon carbide, silicon oxy nitride, silicon oxy carbide, organosilicate glass, plasma-enhanced silicon nitride, constant having a dielectric) material, hydrogen silsesquioxane polymer, methyl silsesquioxane polymer polyphenylene oligomer, methyl doped silica, organosilicate glass, porous organosilicate glass and a dielectric having relative permittivity of about 2.4 or less.

A twenty-second aspect of the present invention is the first aspect, further including: before the removing the lower silicon layer, attaching a handle substrate to an uppermost dielectric layer of the first set of wiring levels, the uppermost dielectric layer of the first set of wiring levels furthest away from the lower silicon layer.

A twenty-third aspect of the present invention is the twenty-second aspect further including: after the forming the second set of wiring levels, removing the handle substrate.

A twenty-fourth aspect of the present invention is the twenty-third aspect, further including: after forming the second set of wiring levels, dicing the substrate into one or more integrated circuit chips.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

It should be understood that the integrated circuit chips of the embodiments of the present invention are advantageously formed on integrated circuit substrates called wafers and that multiple integrated circuits may be fabricated simultaneously on the same wafer and may be separated by a dicing process after fabrication is complete.

Figure 1A:
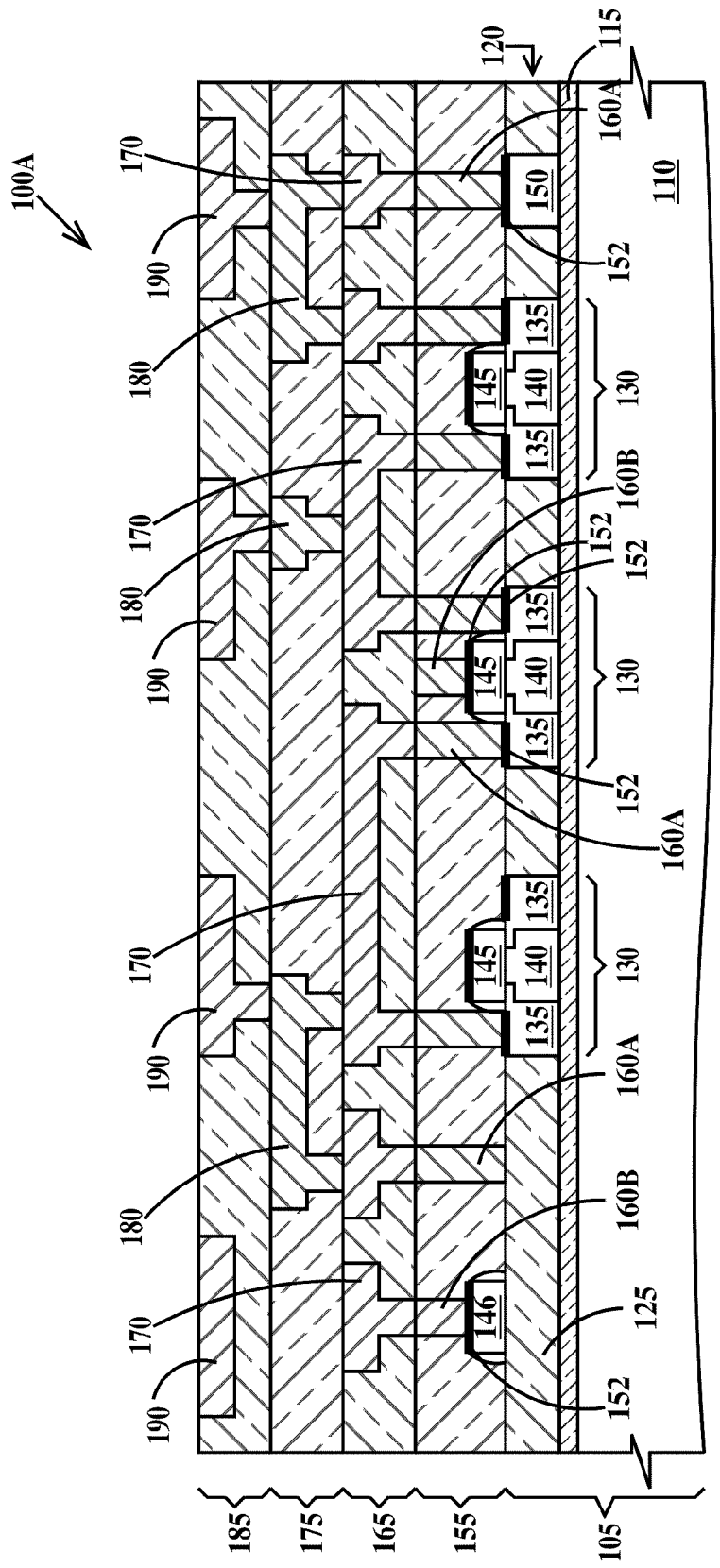
FIGS. 1A through 1E are cross-sectional drawings illustrating fabrication of an integrated circuit chip according to a first embodiment of the present invention.

FIGS. 1A through 1E are cross-sectional drawings illustrating fabrication of an integrated circuit chip according to a first embodiment of the present invention. In FIG. 1A, a wafer 100A is fabricated through pad level. Wafer 100A includes a silicon-on-insulator (SOI) substrate 105 which includes a silicon substrate 110A, a buried oxide layer (BOX) 115 formed on the silicon substrate and a single-crystal silicon layer 120 formed on the BOX. Formed in silicon layer 120 are trench isolation 125 and source/drains 135 and channel regions 140 of field effect transistors (FETs) 130. Also formed in silicon layer 120 are optional silicon regions 150. Formed over channel regions 140 are a gate dielectric (not shown) and, in one example, polysilicon gates 145 of FETs 130 as well as a dummy gate 146. In one example, silicon regions 150 are highly doped N or P-type (between about 1 E19 atm/cm$^3$ and about 1 E21 atm/cm$^3$) in order to reduce the resistance of the contact to less than about 0.5 micro-ohms. An electrically conductive metal silicide layer 152 is formed on exposed silicon surfaces of source/drains 135, gates 145 and diffusion contacts 150 prior to formation of a pre-metal dielectric (PMD) layer 155 to further reduce the "contact" resistance of a metal structures to silicon structures as described infra. Metal silicides are formed by deposition of a metal layer on a silicon surface, heating the silicon surface high enough to cause the metal layer to react with the silicon, and then dissolving away any unreacted metal. Examples of metal silicides include, but are not limited to, platinum, titanium cobalt and nickel silicides.

Formed on top of silicon layer 120 is PMD layer 155. Formed in PMD layer 155 are contacts 160A and 160B. Contacts 160A and 160B are electrically conductive. Contacts 160A electrically contact silicide layer 152 on source/drains 135 and on silicon contact 150. Some of contacts 160A are dummy contacts extending to trench isolation 125. Contacts 160B contact silicide layer 152 on gates 145 and dummy gates 146. PMD layer 155 and contacts 160A and 160B may be considered a wiring level.

Contacts 160A and 160B may be fabricated independently in separate operations or simultaneously. When fabricated simultaneously, first and second type contacts may be formed by etching the respective trenches in situ using a single mask or fabricated using various combinations of photolithographic and hard masks and etches to define the trenches separately, followed by a single metal fill and a chemical mechanical polish (CMP) operation.

Formed on PMD layer 155 is a first inter-level dielectric layer (ILD) 165 including electrically conductive dual-damascene wires 170 in electrical contact with contacts 160. Formed on ILD 165 is a second ILD 175 including electrically conductive dual-damascene wires 180 in electrical contact with wires 170. Formed on ILD 175 is a third ILD 185 including electrically conductive dual-damascene I/O pads 190 in electrical contact with wires 180. Alternatively, wires 170, 180 and pads 190 may be single damascene wires or pads in combination with single damascene vias.

A damascene process is one in which wire trenches or via openings are formed in a dielectric layer, an electrical conductor of sufficient thickness to fill the trenches is deposited on a top surface of the dielectric, and a CMP process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

The etches used in single-damascene and dual damascene processes to form trenches may advantageously be reactive ion etches (RIEs).

In one example, PMD layer 155 comprises boro-phosphorus silicate glass (BPSG) or phosphorus-silicate glass (BSG). In one example, contacts 160A and 160B comprise a titanium/titanium nitride liner and a tungsten core. In one example, ILD 165, 175 and 185 comprise silicon dioxide or a layer of silicon dioxide over a layer of silicon nitride. In one example, wires 170 and 180 and I/O pads 190 comprise a tantalum/tantalum nitride liner and a copper core.

In one example, ILD layers 165, 175 and 185 independently comprise silicon dioxide ($SiO_2$), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) or NBLok (SiC(N, H)).

In one example, ILD layers 165, 175 and 185 independently comprise a low K (dielectric constant) material, examples of which include but are not limited to hydrogen silsesquioxane polymer (HSQ), methyl silsesquioxane polymer (MSQ), SiLIK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH. In one example, a low K dielectric material has a relative permittivity of about 2.4 or less.

Figure 1B:
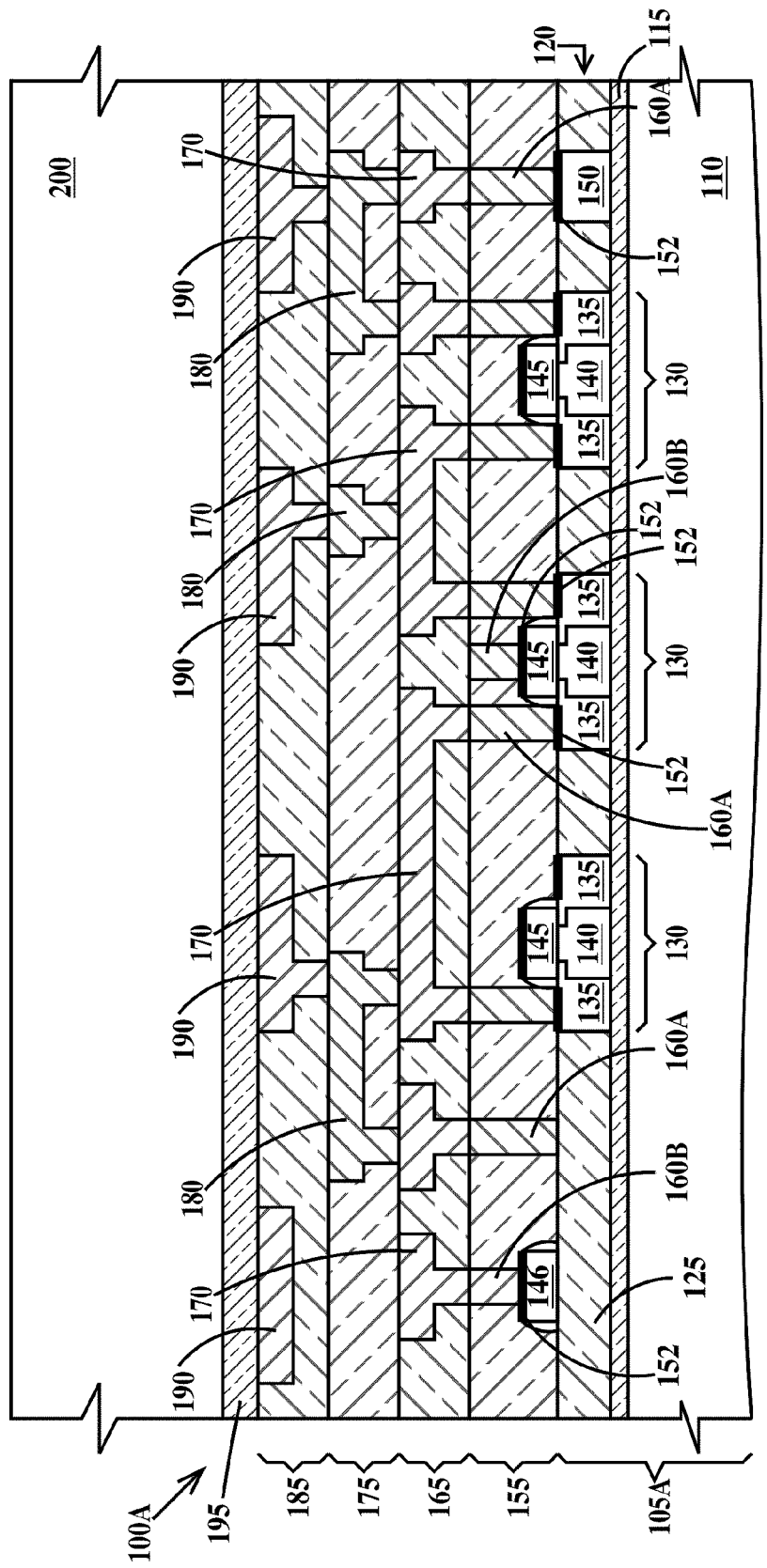

In FIG. 1B, a passivation layer 195 is formed on third ILD 185 and I/O pads 190 and a handle wafer 200 attached to passivation layer 195 using an adhesive (not shown) or by other methods known in the art.

Figure 1C:
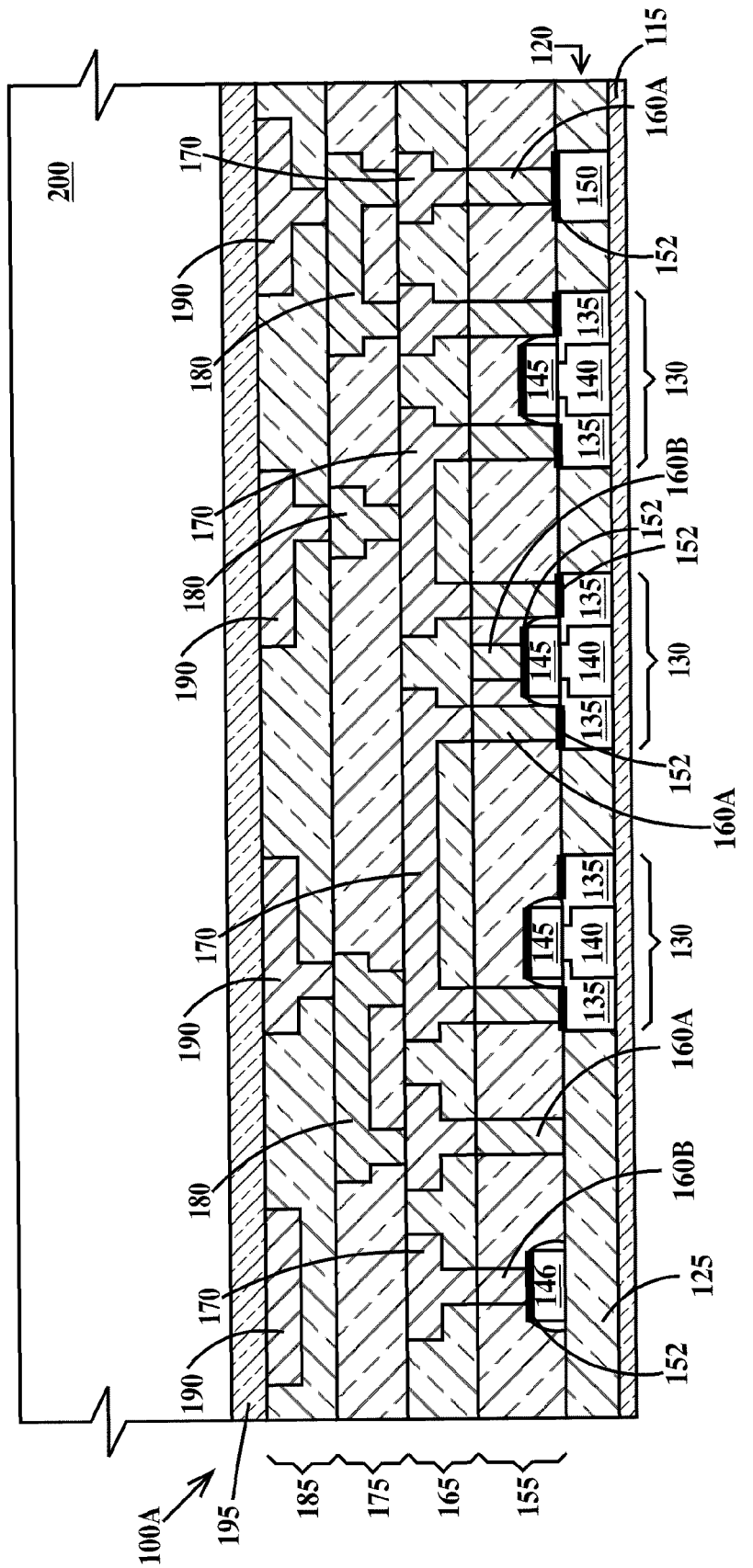

In FIG. 1C, bulk substrate 110 (see FIG. 1B) is removed to expose BOX 115. In one example, bulk substrate 110 is removed by a grinding operation to substantially thin of the bulk substrate operation followed by (1) a chemical etch in a strong base such as aqueous potassium hydroxide or (2) a chemical etch in a mixture of hydrofluoric, nitric and acetic acids or (3) any chemical etch which is selective to etch silicon over silicon dioxide to remove the remaining bulk substrate.

Figure 1D:
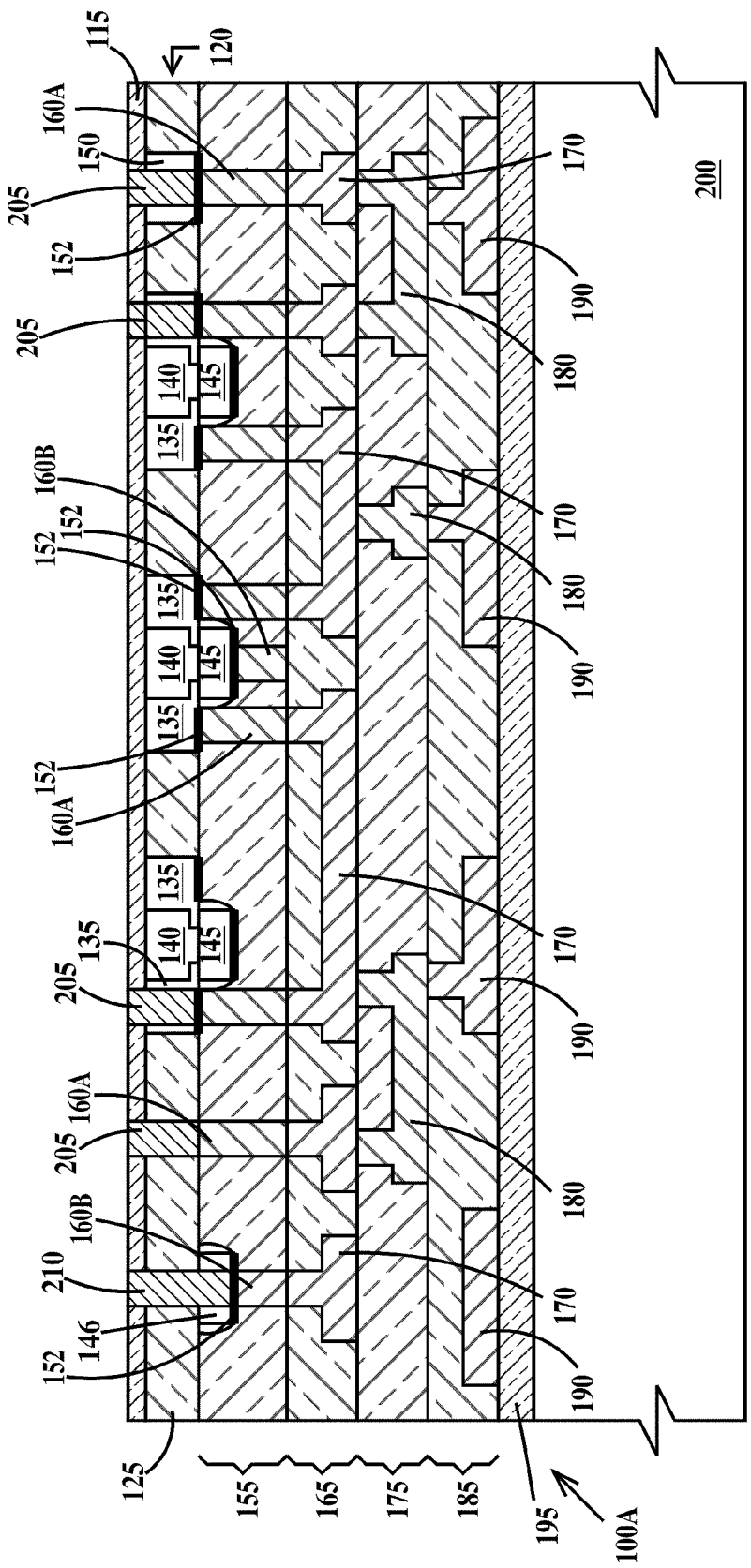

In FIG. 1D, electrically conductive first backside contacts 205 are formed through BOX 115 and silicon layer 120. Contacts 205 extend from the top surface of BOX 115 to silicide layer 152 on source/drains 135 and silicon contact 150. In one example, contacts 205 are formed by a single damascene process. In one example, contacts 205 comprise a titanium/titanium nitride liner and a tungsten core.

Electrically conductive second backside contacts 210 are foil led through BOX 115 and trench isolation 125. Contacts 210 extend from the top surface of BOX 115 to silicide layer 152 on dummy gate 146 and to selected contacts 160B. In the case of dummy gate 146, contact 210 extends through the gate dielectric layer (not shown) as well.

Contacts 205 and 210 may be fabricated independently in separate operations or simultaneously. When fabricated simultaneously, first and second type contacts may be formed by etching the respective trenches in situ using a single mask or fabricated using various combinations of photolithographic and hard masks and etches to define the trenches separately, followed by a single metal fill and CMP operation.

Figure 1E:
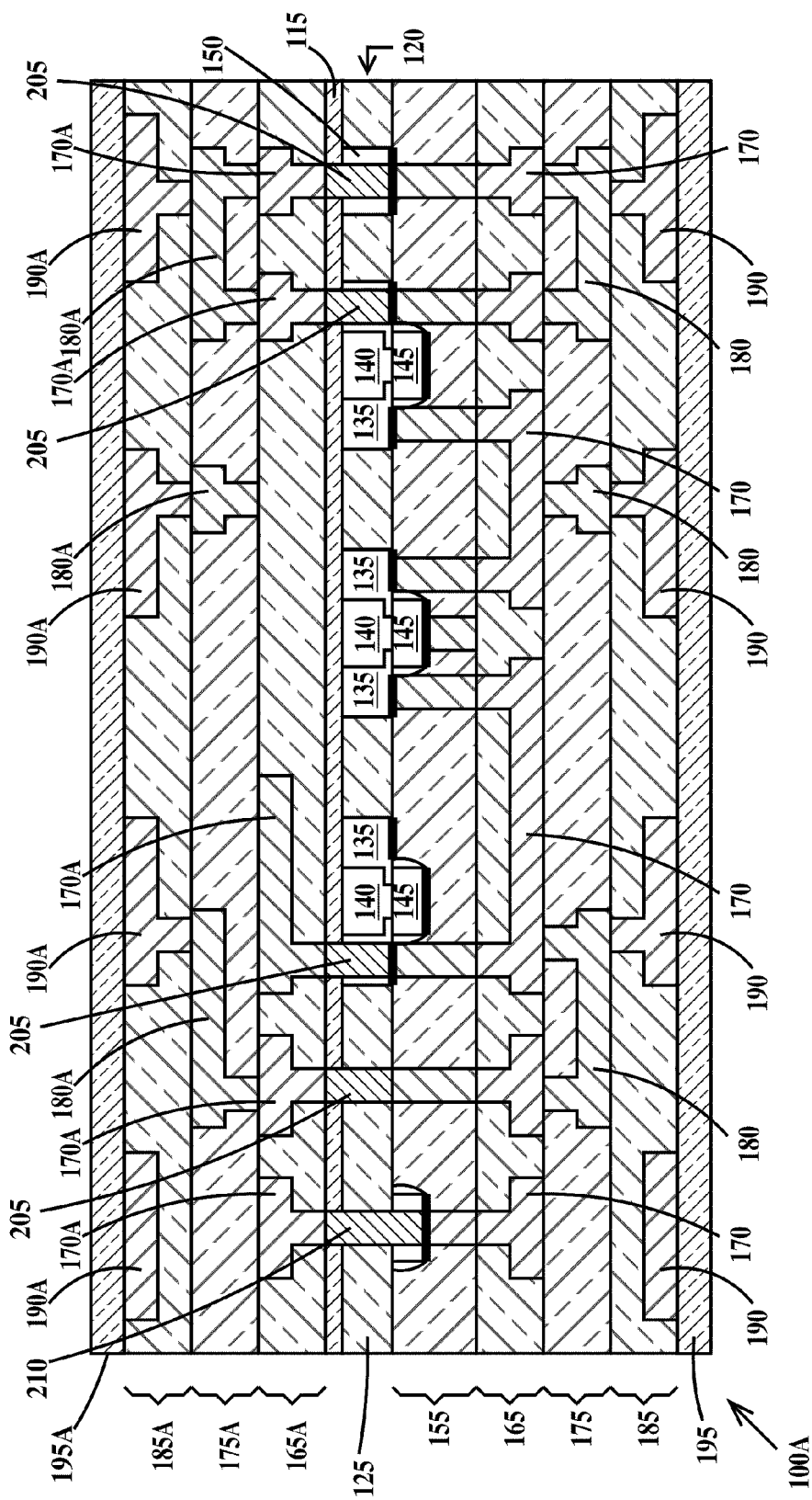

In FIG. 1E, formed on BOX 115 is first inter-level dielectric layer (ILD) 165A including electrically conductive dual-damascene wires 170A in electrical contact with contacts 160A. Formed on ILD 165A is second ILD 175A including electrically conductive dual-damascene wires 180A in electrical contact with wires 170A. Formed on ILD 175A is third ILD 185A including electrically conductive dual-damascene I/O pads 190A in electrical contact with wires 180A. Alternatively, wires 170A, 180A and pads 190A of may be single damascene wires in combination with single damascene vias. A passivation layer 195A is formed on third ILD 185A and I/O pads 190A and handle wafer 200 is removed. This completes fabrication of wafer 100A which know can be externally wired (via pads 190 and 190A) on two opposite sides.

Figure 2A:
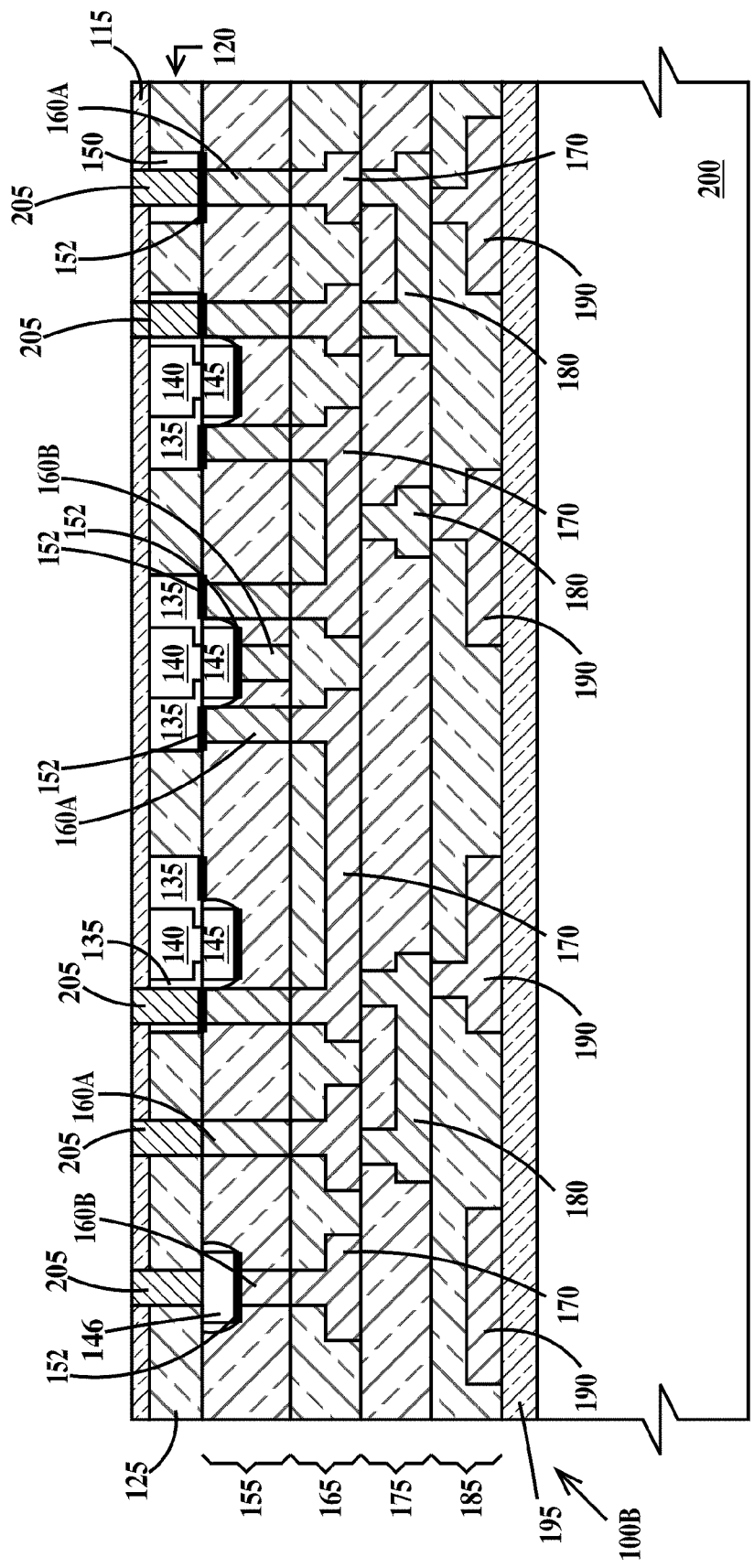
FIGS. 2A and 2B are cross-sectional drawings illustrating fabrication of an integrated circuit chip according to a second embodiment of the present invention.
Figure 2B:
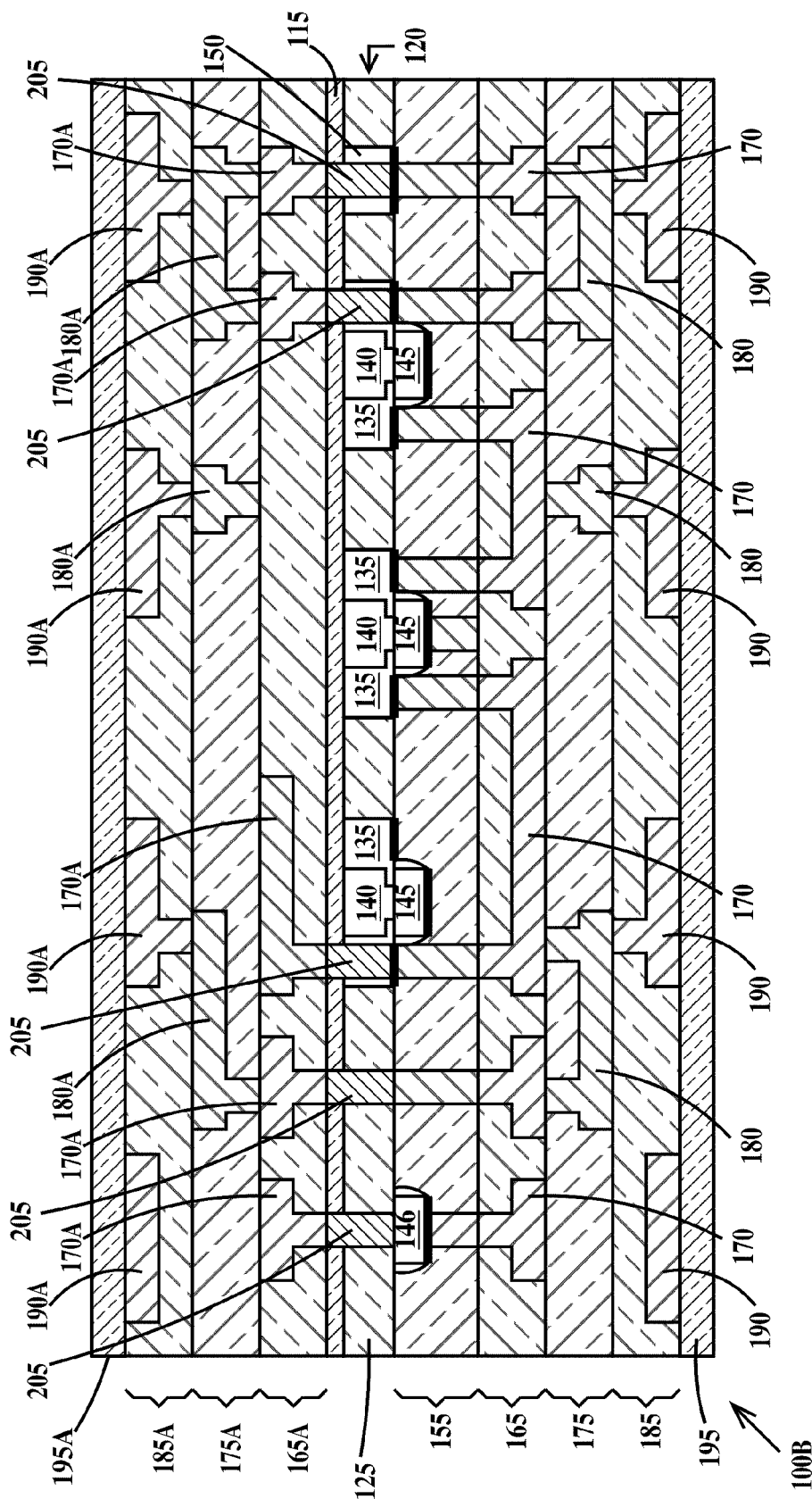

FIGS. 2A and 2B are cross-sectional drawings illustrating fabrication of an integrated circuit chip according to a second embodiment of the present invention. The second embodiment of the present invention differs from the first embodiment of the present invention by contact 210 of FIGS. 1D and 1E being replaced by contacts 205 in a wafer 100B. Processing as illustrated in FIGS. 1A through 1C and described supra in are performed and then FIG. 2A replaces FIG. 1D and FIG. 2B replaces FIG. 1E.

In FIGS. 2A and 2B a contact 205 is in electrical and physical contact with the polysilicon of dummy gate 146. In one example, dummy gate 146 is advantageously highly doped N or P-type (between about 1 E19 atm/cm$^3$ and about 1 E21 atm/cm$^3$) in order to reduce the resistance of the contact to less than about 0.5 micro-ohms. Thus all backside contacts are etched to the same depth.

Figure 3A:
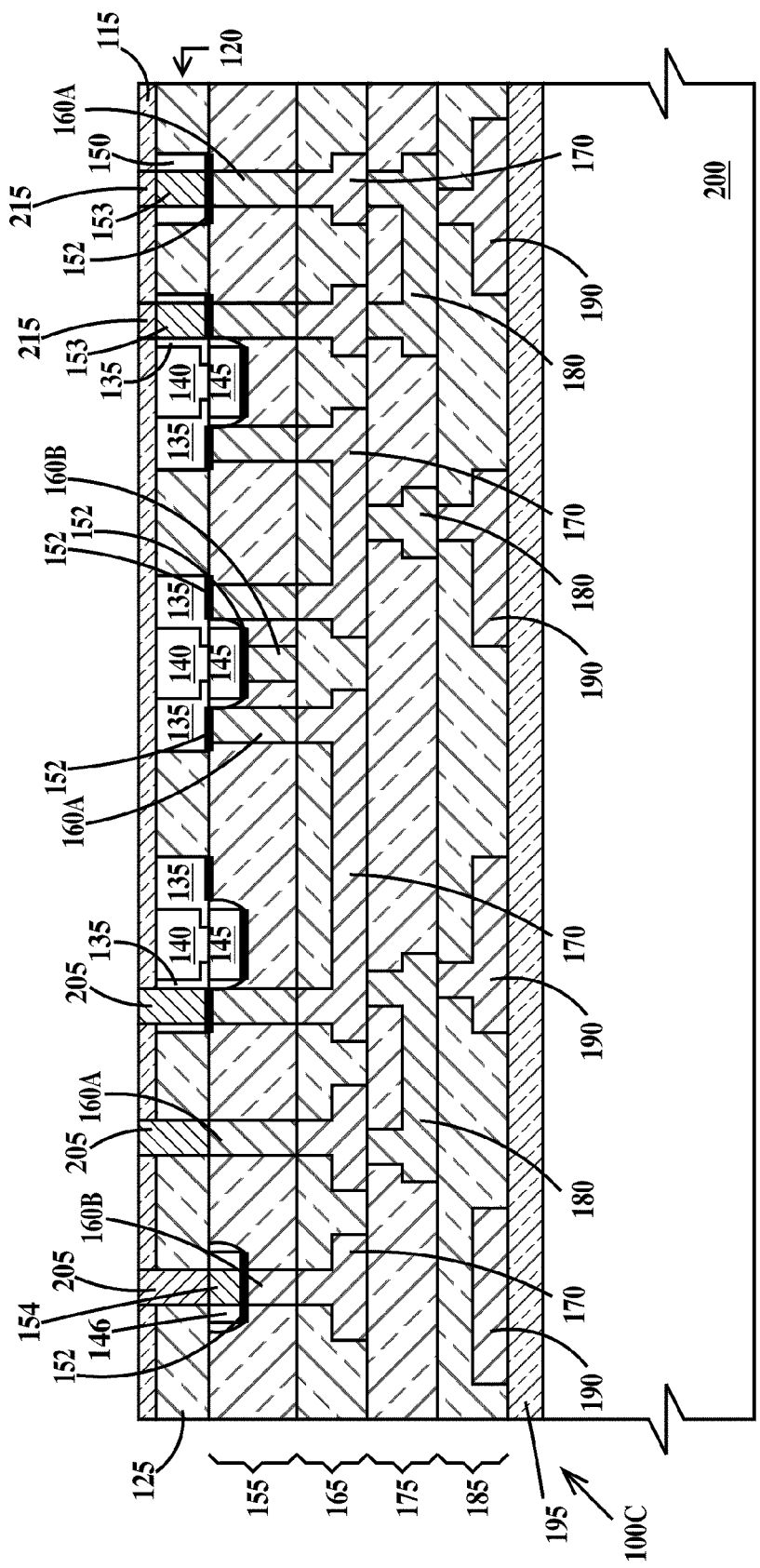
FIGS. 3A and 3B are cross-sectional drawings illustrating fabrication of an integrated circuit chip according to a third embodiment of the present invention.
Figure 3B:
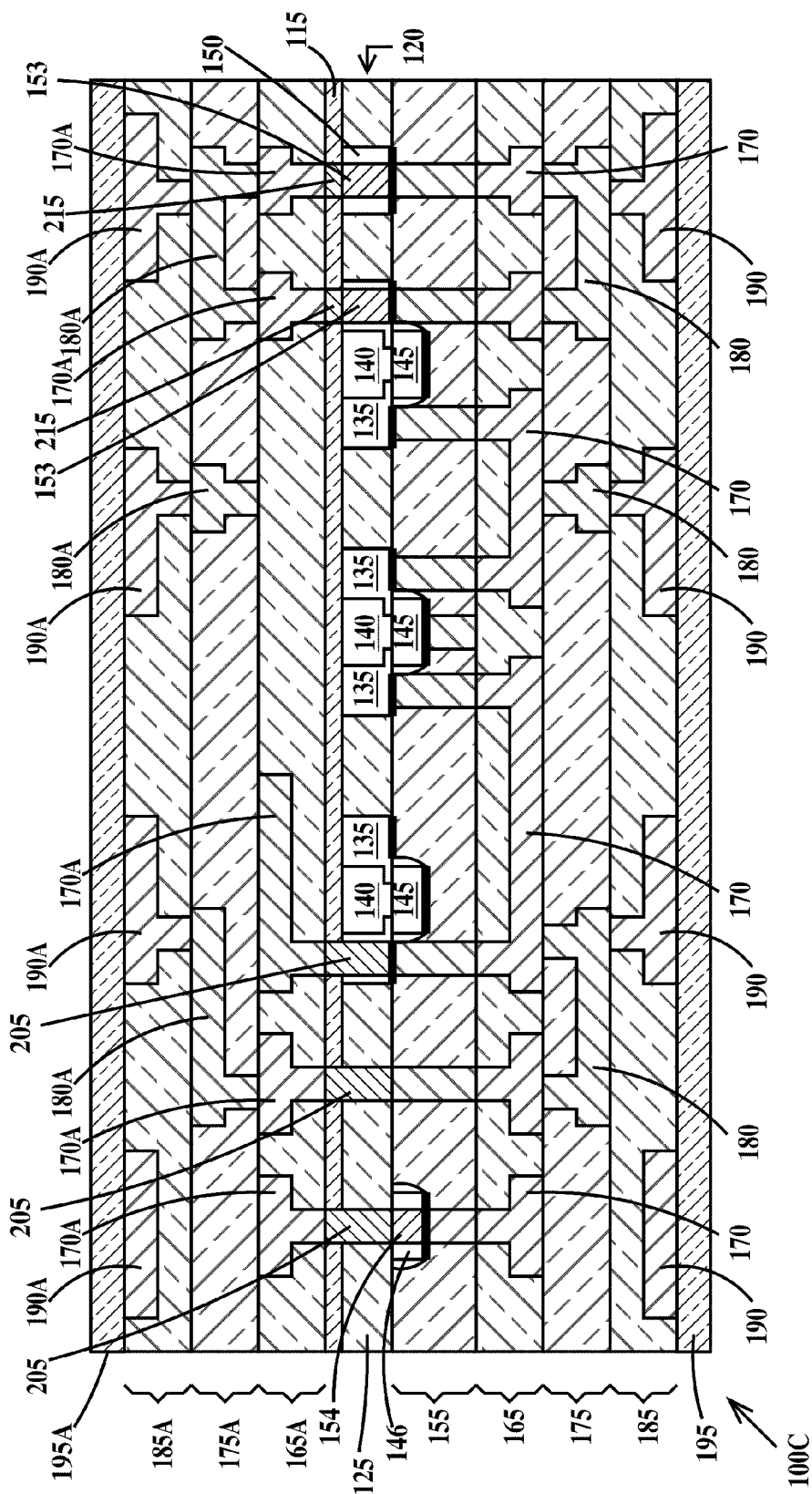

FIGS. 3A and 3B are cross-sectional drawings illustrating fabrication of an integrated circuit chip according to a second embodiment of the present invention. The third embodiment of the present invention differs from the first embodiment of the present invention by utilization of silicide-to-silicide contacts in a wafer 100C. Processing as illustrated in FIGS. 1A through 1C and described supra in are performed and then FIG. 3A replaces FIG. 1D and FIG. 3B replaces FIG. 1E.

In FIGS. 3A and 3B, an electrically conductive metal silicide layer 153 is formed from the backside of wafer 100C in selected source/drains 135 by forming contact openings in BOX layer 115, depositing a metal layer, annealing to form a metal silicide and removing the excess metal. Then contact metal (i.e. titanium/titanium nitride liner and a tungsten core) is used to fill the contact openings. Silicide layer 153 is in physical and electrical contact with silicide layer 152 on selected source/drains 135 and a contact 215 is in physical and electrical contact with silicide layer 153. Also an electrically conductive metal silicide layer 154 is formed in the polysilicon of dummy gate 146 after a contact openings is formed through BOX layer 115, PMD layer 125 and the gate dielectric layer (not shown) and a contact 205 is in physical and electrical contact with silicide layer 154. Again, examples of metal silicides include, but are not limited to, platinum, titanium cobalt and nickel silicides.

FIGS. 4A through 4E are cross-sectional drawings illustrating fabrication of an integrated circuit chip according to a third embodiment of the present invention. The third embodiment of the present invention differs from the first embodiment of the present invention with fully silicided source/drains, gates and silicon contacts replacing the silicide layer of the first embodiment.

Figure 4A:
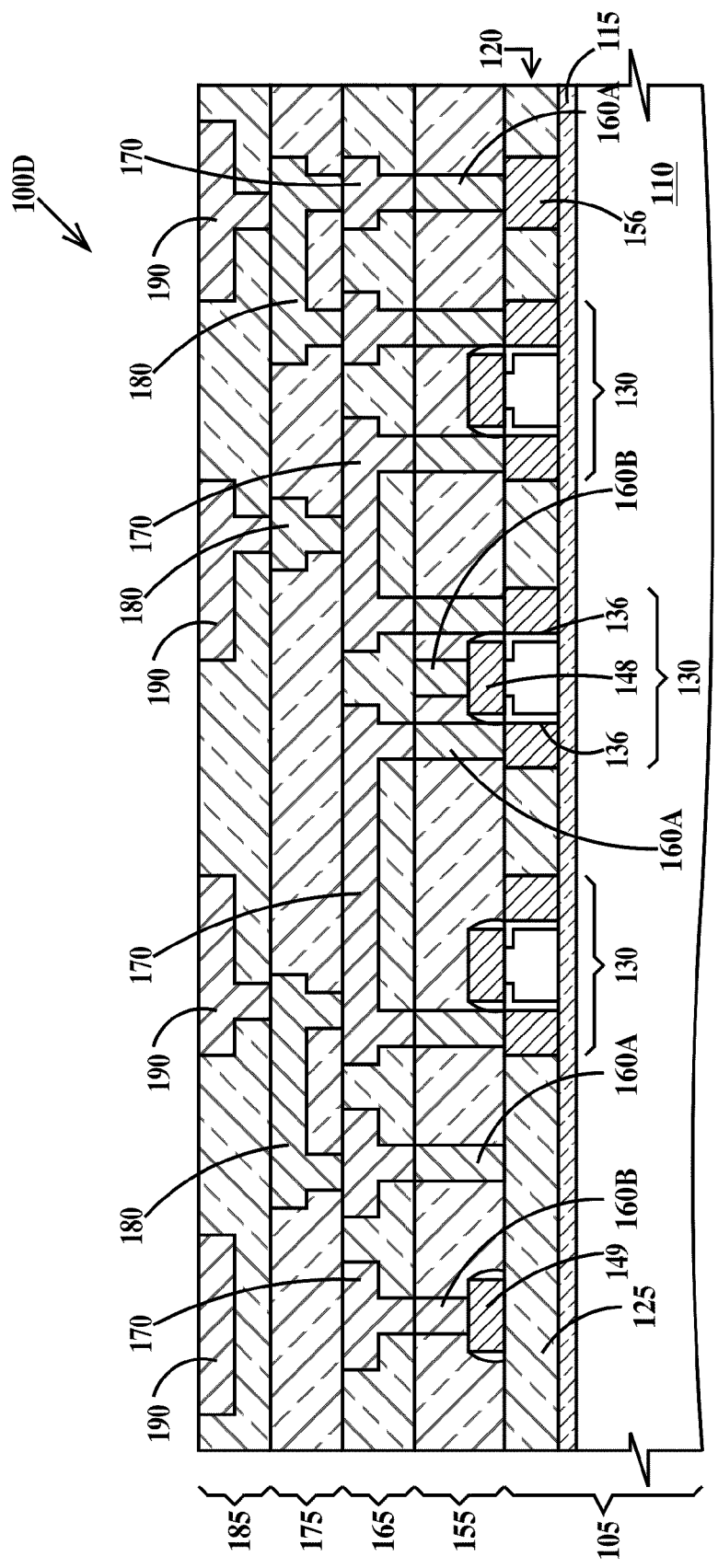
FIGS. 4A through 4E are cross-sectional drawings illustrating fabrication of an integrated circuit chip according to a fourth embodiment of the present invention.

FIG. 4A is the same as FIG. 1A except a wafer 100B differs from wafer 100D (see FIG. 1A) in that source drains 135 (see FIG. 1A) are replaced with fully silicided source/drains 136, gates 145 (see FIG. 1A) are replaced with fully silicided gates 148, dummy gates 146 (see FIG. 1A) are replaced with fully silicided dummy gates 149 and silicon contact 150 (see FIG. 1A) is replaced with fully silicided contact 156. A fully silicided source drain is one in which the silicide layer extends from a top surface of the source drain to BOX 115. Note, that the silicide does not extend the fully silicided gates. A fully silicided gate is one in which the silicide layer extends from a top surface of the gate to the gate dielectric layer. A fully silicided silicon contact is one in which the silicide layer extends from a top surface of the silicon contact to BOX 115.

Fully silicided source/drains, gates and silicon contacts are formed by deposition of a thick metal layer on a silicon surface, heating the silicon surface high enough to cause the metal layer to react with the silicon, and then dissolving away any unreacted metal. The thickness of the metal layer is great enough to supply sufficient metal, by thermal diffusion through the silicon, to react with silicon atoms throughout the source/drain, gate or silicon contact. Again, examples of metal silicides include, but are not limited to, platinum, titanium cobalt and nickel silicides.

Figure 4B:
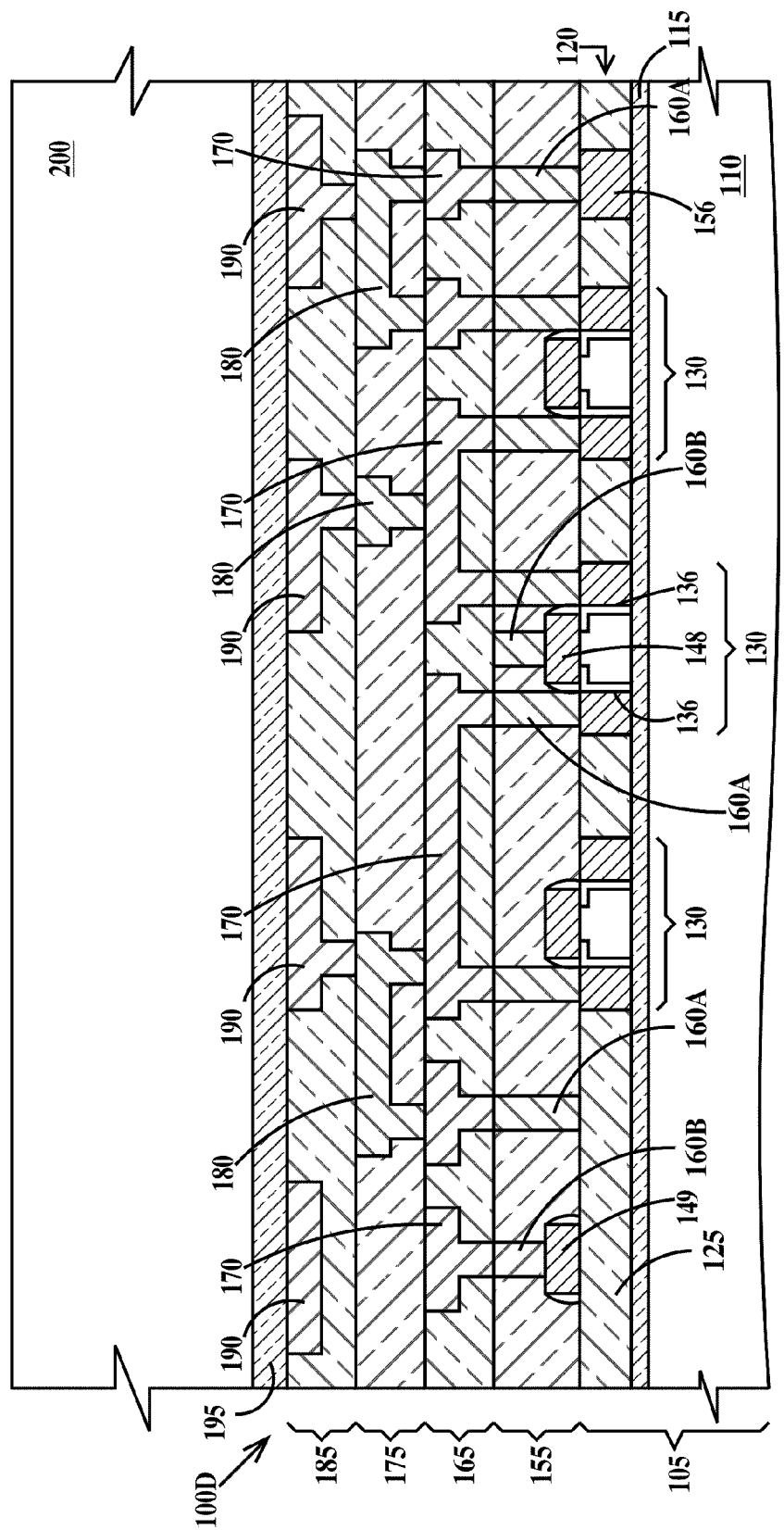
Figure 4C:
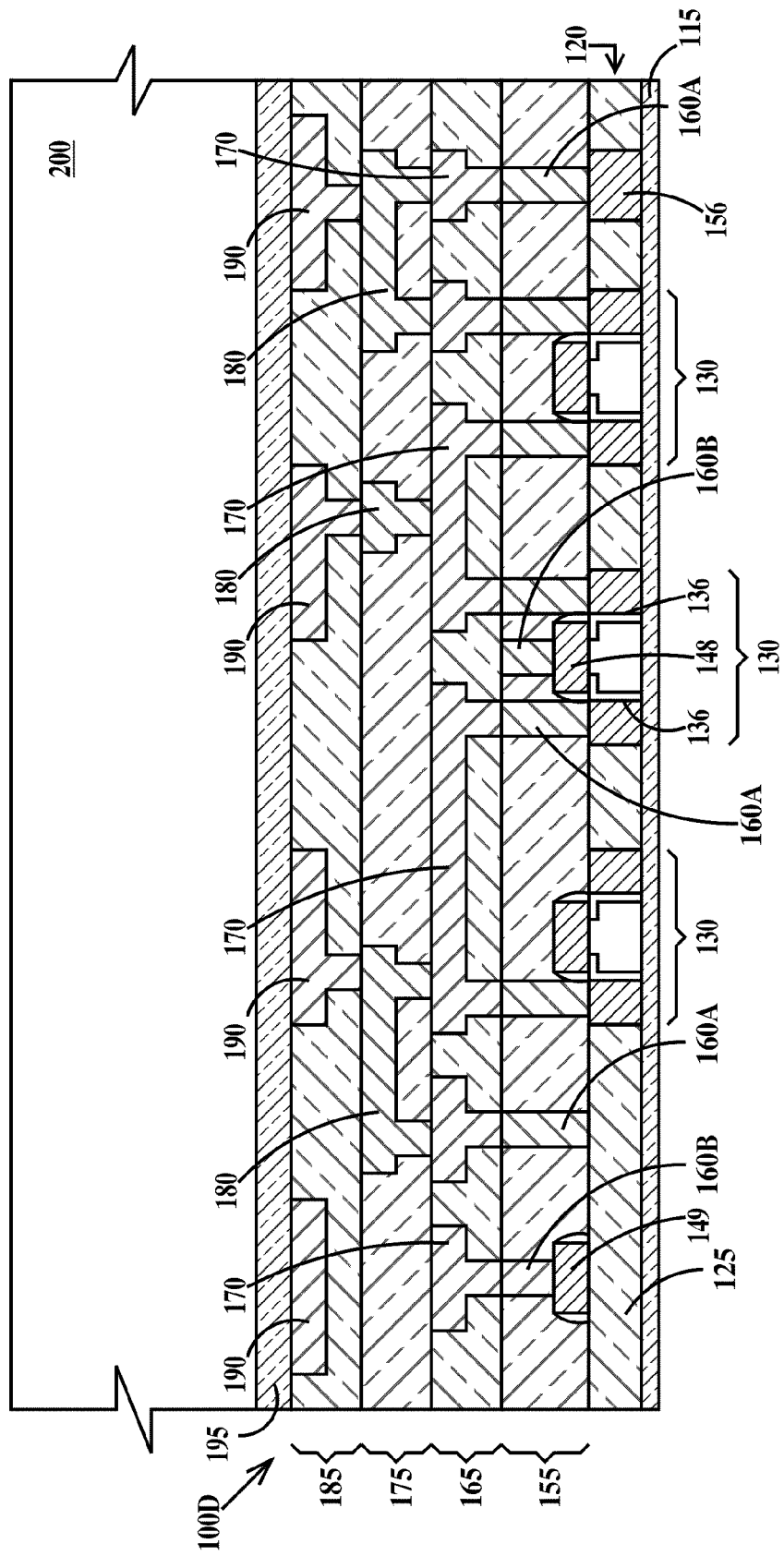

FIGS. 4B and 4C are essentially the same as FIGS. 1B and 1C respectively except for the differences described supra.

Figure 4D:
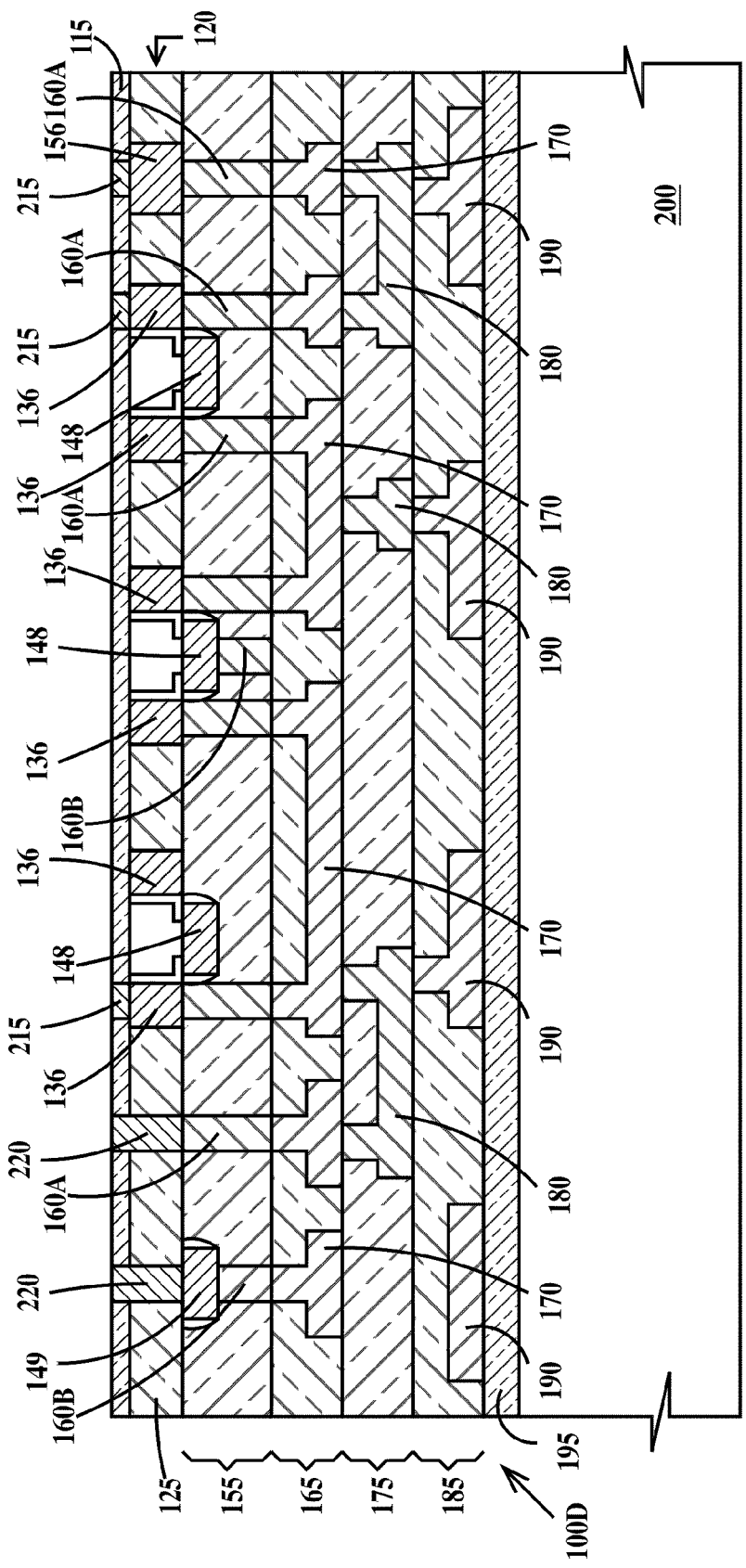

FIG. 4D is the same as FIG. 1D except for the differences described supra and the replacement of contacts 205 and 210 of FIG. 1D by respective contacts 215 and 220 of FIG. 4D. In FIG. 4D, electrically conductive backside contacts 215 are formed through BOX 115. Contacts 215 extend from the top surface of BOX 115 to the bottoms of fully silicided source/drains 136 and silicon contact 156. In one example, contacts 215 are formed by a single damascene process. In one example, contacts 215 comprise a titanium/titanium nitride liner and a tungsten core.

Electrically conductive second backside contacts 220 are formed through BOX 115 and trench isolation 125. Contacts 220 extend from the top surface of BOX 115 to the bottom surface of fully silicided dummy gate 146 and to selected contacts 160A. In the case of dummy gate 146, contact 220 extends through the gate dielectric layer (not shown) as well. Thus, contacts 215 and 220 do not have to etched as deeply or through silicon as contacts 205 and 210 of FIG. 1D.

First and second contacts 215 and 220 may be fabricated independently in separate operations or simultaneously. When fabricated simultaneously, first and second type contacts may be formed by etching the respective trenches in situ using a single mask or fabricated using various combinations of photolithographic and hard masks and etches to define the trenches separately, followed by a single metal fill and CMP operation.

Figure 4E:
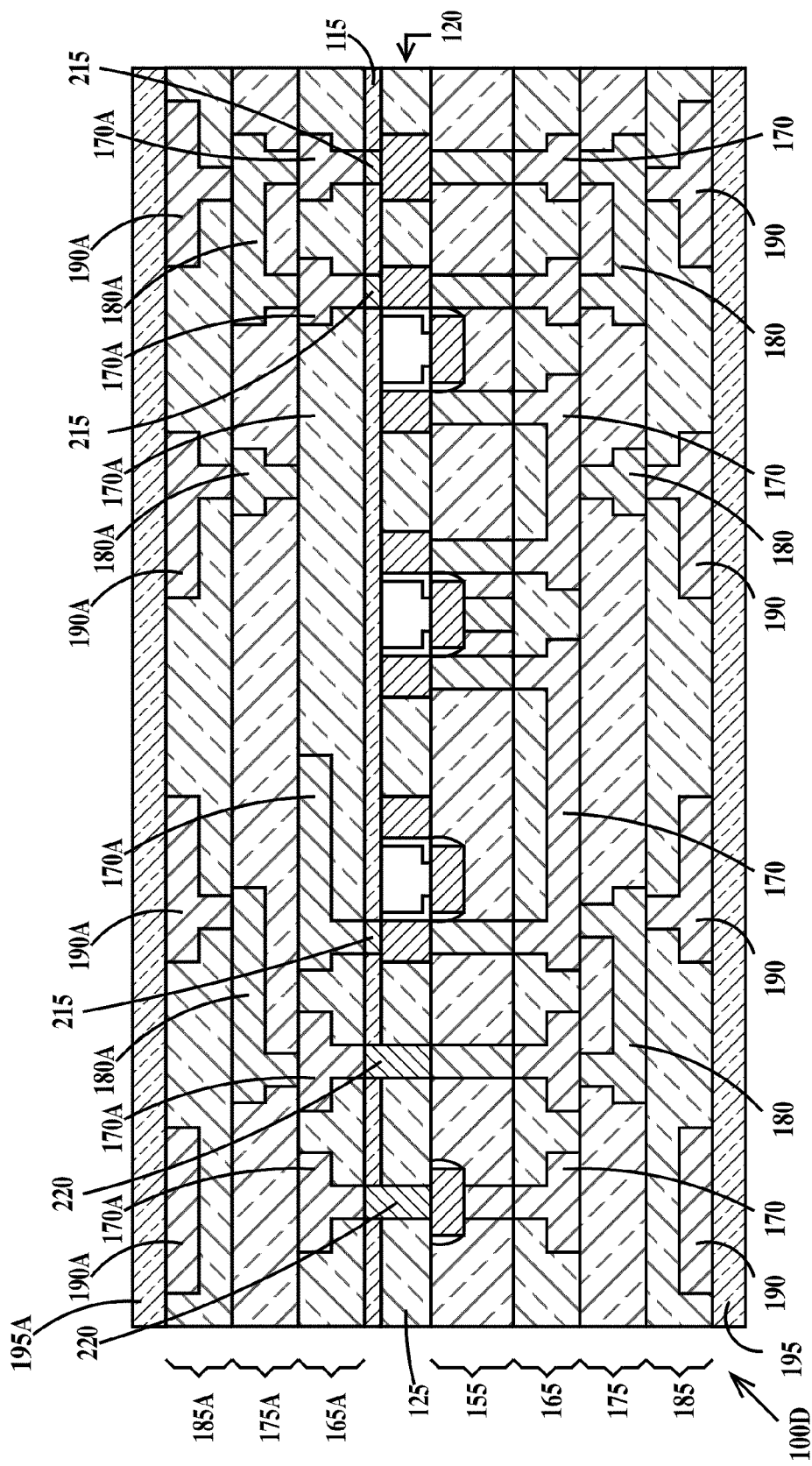

FIG. 4E is essentially the same as FIG. 1E except for the differences described supra.

While each of wafers 100A, 100B, 110C and 110D has been illustrated with a single contact level, two wiring levels and a pad level, more or less contact and wiring levels may be fabricated and wafers 100A and 110B may be fabricated with different numbers of contact and/or wiring levels. Also, handle wafer 200A may be detached from wafers 100A, 100B, 110C and 110D before or after dicing of wafers 100A, 100B, 110C and 110D into individual integrated circuits.

Thus, the embodiments of the present invention provide for greater wiring density and increased contact pad count for connection of integrated circuit chips to the next level of packaging.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor structure, comprising:
a substrate comprising an upper silicon layer on a top surface of a buried oxide layer;
a pre-metal dielectric layer on a top surface of said upper silicon layer;
one or more field effect transistors, each field effect transistor of said one or more field effect transistors comprising first and second source/drains formed in said upper silicon layer, said first and second source/drains extending from a top surface of said upper silicon layer to said top surface of said buried oxide layer, a gate electrode isolated from said upper silicon layer by a gate dielectric layer and metal silicide layers on respective top surfaces of said first and second source/drains and on a top surface of said gate electrode;

a first set of two or more wiring levels, each wiring level of said first set of two or more wiring levels comprising electrically conductive wires in a corresponding dielectric layer, a lowermost wiring level of said first set of two or more wiring levels on a top surface of said pre-metal dielectric layer;

electrically conductive first contacts, a first contact of said first contacts extending from said top surface of said pre-metal dielectric layer to said metal silicide layer on a first source/drain of a first field effect transistor of said one or more field effect transistors, one or more wires of said lowermost wiring level of said first set of wiring levels in electrical contact with said first contact;

electrically conductive second contacts, a second contact of said second contacts extending from a bottom surface of said buried oxide layer through said first source/drain of said first field effect transistor to a bottom surface of said metal silicide layer of said first source/drain of said first field effect transistor; and a second set of two or more wiring levels, each wiring level of said second set of said two or more wiring levels comprising electrically conductive wires in a corresponding dielectric layer, a lowermost wiring level of said second set of two or more wiring levels on said bottom surface of said buried oxide layer, one or more wires of said lowermost wiring level of said second set of wiring levels in electrical contact with said second contact.

2. The structure of claim 1, wherein at least one additional contact of said first contacts extends from said top surface of said pre-metal dielectric layer to said metal silicide layer on a corresponding gate electrode of an additional field effect transistor of said one or more field effect transistors.

3. The structure of claim 1, wherein at least one additional contact of said first contacts extends from said top surface of said pre-metal dielectric layer to said metal silicide layer on a corresponding source/drain of an additional field effect transistor of said one or more field effect transistors.

4. The structure of claim 1, wherein said metal silicide layer comprises platinum silicide, titanium silicide, cobalt silicide or nickel silicide.

5. The structure of claim 1, wherein said electrically conductive metal silicide regions of all source/drains extend from respective top surfaces of said source/drains to respective bottom surfaces of said source/drains; and said electrically conductive metal silicide layers of all said gate electrodes extend from respective top surfaces of said gate electrodes to respective bottom surfaces of said gate electrodes.

6. The structure of claim 1, further including:
a first dielectric passivation on an uppermost wiring level of said first set of wiring levels; and
a second dielectric passivation on an uppermost wiring level of said second set of wiring levels.

7. The structure of claim 1, wherein a bottom surface of said second contact is coplanar with said bottom surface of said buried oxide layer and a top surface of said second contact is coplanar with a bottom surface of the metal silicide layer of said selected source/drain of said selected field effect transistor.

8. A structure, comprising:
a substrate comprising an upper silicon layer on a top surface of a buried oxide layer;
a pre-metal dielectric layer on a top surface of said upper silicon layer;
one or more field effect transistors, each field effect transistor of said one or more field effect transistors comprising first and second source/drains formed in said upper silicon layer, a gate electrode isolated from said upper silicon layer by a gate dielectric layer and metal silicide layers on respective top surfaces of said first and second source/drains and on a top surface of said gate electrode;

a first set of two or more wiring levels, each wiring level of said first set of two or more wiring levels comprising electrically conductive wires in a corresponding dielectric layer, a lowermost wiring level of said first set of two or more wiring levels on a top surface of said pre-metal dielectric layer;

electrically conductive first contacts, wires of said lowermost wiring level of said first wiring levels in electrical contact with said first contacts;

a second set of two or more wiring levels, each wiring level of said second set of said two or more wiring levels comprising electrically conductive wires in a corresponding dielectric layer, a lowermost wiring level of said second set of two or more wiring levels on said bottom surface of said buried oxide layer;

electrically conductive second contacts, wires of said lowermost wiring level of said second set of wiring levels in electrical contact with said second contacts;

a dielectric trench isolation in regions of said upper silicon layer, said trench isolation extending from said top surface of said upper silicon layer to said top surface of said buried oxide layer, a top surface of said dielectric trench isolation coplanar with said top surface of said upper silicon layer, a bottom surface of said dielectric trench isolation coplanar with said top surface of said buried oxide layer;

one or more silicon contact regions in said upper silicon layer and said metal silicide layer on top surfaces of said one or more silicon contact regions, said silicon contact regions electrically isolated from said one or more field effect transistors by said dielectric trench isolation;

wherein at least one of said first contacts extends from said top surface of said pre-metal dielectric layer to said metal silicide layer on a corresponding silicon contact region of said one or more silicon contact regions, and wherein at least one of said second contacts extends from said bottom surface of said buried oxide layer through said corresponding silicon contact region to said metal silicide of said corresponding silicon contact region.

9. The structure of claim 8, wherein at least one additional contact of said first contacts extends from said top surface of said pre-metal dielectric layer to said metal silicide layer on a corresponding gate electrode of an additional field effect transistor of said one or more field effect transistors.

10. The structure of claim 8, wherein at least one additional contact of said first contacts extends from said top surface of said pre-metal dielectric layer to said metal silicide layer on a corresponding source/drain of an additional field effect transistor of said one or more field effect transistors.

11. The structure of claim 8, wherein said metal silicide layer comprises platinum silicide, titanium silicide, cobalt silicide or nickel silicide.

12. The structure of claim 8, wherein said electrically conductive metal silicide regions of all source/drains extend from respective top surfaces of said source/drains to respective bottom surfaces of said source/drains and said electrically conductive metal silicide layers of all said gate electrodes extend from respective top surfaces of said gate electrodes to respective bottom surfaces of said gate electrodes.

13. The structure of claim 8, further including:
a first dielectric passivation on an uppermost wiring level of said first set of wiring levels; and
a second dielectric passivation on an uppermost wiring level of said second set of wiring levels.

14. A structure, comprising:
a substrate comprising an upper silicon layer on a top surface of a buried oxide layer;
a pre-metal dielectric layer on a top surface of said upper silicon layer;
one or more field effect transistors, each field effect transistor of said one or more field effect transistors comprising first and second source/drains formed in said upper silicon layer, a gate electrode isolated from said upper silicon layer by a gate dielectric layer and metal silicide layers on respective top surfaces of said first and second source/drains and on a top surface of said gate electrode;
a first set of two or more wiring levels, each wiring level of said first set of two or more wiring levels comprising electrically conductive wires in a corresponding dielectric layer, a lowermost wiring level of said first set of two or more wiring levels on a top surface of said pre-metal dielectric layer;
electrically conductive first contacts, wires of said lowermost wiring level of said first wiring levels in electrical contact with said first contacts;
a second set of two or more wiring levels, each wiring level of said second set of said two or more wiring levels comprising electrically conductive wires in a corresponding dielectric layer, a lowermost wiring level of said second set of two or more wiring levels on said bottom surface of said buried oxide layer;
electrically conductive second contacts, wires of said lowermost wiring level of said first wiring levels in electrical contact with said first contacts;
a dielectric trench isolation in regions of said upper silicon layer, said trench isolation extending from said top surface of said upper silicon layer to said top surface of said buried oxide layer, a top surface of said dielectric trench isolation coplanar with said top surface of said upper silicon layer, a bottom surface of said dielectric trench isolation coplanar with said top surface of said buried oxide layer; and
wherein at least one of said first contacts extends from said top surface of said pre-metal dielectric layer to a bottom surface of said pre-metal dielectric layer to contact a corresponding contact of said second contacts, said corresponding contact extending from said bottom surface of said buried oxide layer through said dielectric trench isolation to said top surface of said dielectric trench isolation.

15. The structure of claim 14, wherein at least one additional contact of said first contacts extends from said top surface of said pre-metal dielectric layer to said metal silicide layer on a corresponding gate electrode of an additional field effect transistor of said one or more field effect transistors.

16. The structure of claim 14, wherein at least one additional contact of said first contacts extends from said top surface of said pre-metal dielectric layer to said metal silicide layer on a corresponding source/drain of an additional field effect transistor of said one or more field effect transistors.

17. The structure of claim 14, wherein said metal silicide layer comprises platinum silicide, titanium silicide, cobalt silicide or nickel silicide.

18. The structure of claim 14, wherein said electrically conductive metal silicide layers of all source/drains extend from respective top surfaces of said source/drains to respective bottom surfaces of said source/drains and said electrically conductive metal silicide layers of all said gate electrodes extend from respective top surfaces of said gate electrodes to respective bottom surfaces of said gate electrodes.

19. The structure of claim 14, further including:
a first dielectric passivation on an uppermost wiring level of said first set of wiring levels; and
a second dielectric passivation on an uppermost wiring level of said second set of wiring levels.

20. A structure, comprising:
a substrate comprising an upper silicon layer on a top surface of a buried oxide layer;
a pre-metal dielectric layer on a top surface of said upper silicon layer;
one or more field effect transistors, each field effect transistor of said one or more field effect transistors comprising first and second source/drains formed in said upper silicon layer, a gate electrode isolated from said upper silicon layer by a gate dielectric layer and metal silicide layers on respective top surfaces of said first and second source/drains and on a top surface of said gate electrode;
a first set of two or more wiring levels, each wiring level of said first set of two or more wiring levels comprising electrically conductive wires in a corresponding dielectric layer, a lowermost wiring level of said first set of two or more wiring levels on a top surface of said pre-metal dielectric layer;
electrically conductive first contacts, wires of said lowermost wiring level of said first wiring levels in electrical contact with said first contacts;
a second set of two or more wiring levels, each wiring level of said second set of said two or more wiring levels comprising electrically conductive wires in a corresponding dielectric layer, a lowermost wiring level of said second set of two or more wiring levels on said bottom surface of said buried oxide layer;
electrically conductive second contacts, wires of said lowermost wiring level of said first wiring levels in electrical contact with said first contacts;
a dielectric trench isolation in regions of said upper silicon layer, said trench isolation extending from said top surface of said upper silicon layer to said top surface of said buried oxide layer, a top surface of said dielectric trench isolation coplanar with said top surface of said upper silicon layer, a bottom surface of said dielectric trench isolation coplanar with said top surface of said buried oxide layer;
one or more polysilicon dummy gate electrodes in said pre-metal dielectric layer, a respective metal silicide layer on a top surface of each dummy gate electrode of said one or more dummy gate electrodes;
wherein at least one of said first contacts is coplanar with and extends from said top surface of said pre-metal dielectric layer to said metal silicide layer of a corresponding polysilicon dummy gate electrode of said one or more dummy gate electrodes, and
wherein at least one of said second contacts extends from said bottom surface of said buried oxide layer through said upper silicon layer and through said polysilicon of said corresponding polysilicon dummy gate electrode to said metal silicide layer on said corresponding dummy gate electrode.

21. The structure of claim 20, wherein at least one additional contact of said first contacts extends from said top surface of said pre-metal dielectric layer to said metal silicide layer on a corresponding gate electrode of an additional field effect transistor of said one or more field effect transistors.

22. The structure of claim 20, wherein at least one additional contact of said first contacts extends from said top surface of said pre-metal dielectric layer to said metal silicide layer on a corresponding source/drain of an additional field effect transistor of said one or more field effect transistors.

23. The structure of claim 20, wherein said metal silicide layer comprises platinum silicide, titanium silicide, cobalt silicide or nickel silicide.

24. The structure of claim 20, wherein said electrically conductive metal silicide regions of all source/drains extend from respective top surfaces of said source/drains to respective bottom surfaces of said source/drains and said electrically conductive metal silicide layers of all said gate electrodes extend from respective top surfaces of said gate electrodes to respective bottom surfaces of said gate electrodes.

25. The structure of claim 20, further including:
  a first dielectric passivation on an uppermost wiring level of said first set of wiring levels; and
  a second dielectric passivation on an uppermost wiring level of said second set of wiring levels.

26. A structure, comprising:
  a substrate comprising an upper silicon layer on a top surface of a buried oxide layer;
  a pre-metal dielectric layer on a top surface of said upper silicon layer;
  one or more field effect transistors, each field effect transistor of said one or more field effect transistors comprising first and second source/drains formed in said upper silicon layer, a gate electrode isolated from said upper silicon layer by a gate dielectric layer, and metal silicide layers on respective top surfaces of said first and second source/drains and on a top surface of said gate electrode;
  a first set of two or more wiring levels, each wiring level of said first set of two or more wiring levels comprising electrically conductive wires in a corresponding dielectric layer, a lowermost wiring level of said first set of two or more wiring levels on a top surface of said pre-metal dielectric layer;
  electrically conductive first contacts, wires of said lowermost wiring level of said first wiring levels in electrical contact with said first contacts;
  a second set of two or more wiring levels, each wiring level of said second set of said two or more wiring levels comprising electrically conductive wires in a corresponding dielectric layer, a lowermost wiring level of said second set of two or more wiring levels on said bottom surface of said buried oxide layer;
  electrically conductive second contacts, wires of said lowermost wiring level of said first wiring levels in electrical contact with said first contacts;
  a dielectric trench isolation in regions of said upper silicon layer, said trench isolation extending from said top surface of said upper silicon layer to said top surface of said buried oxide layer, a top surface of said dielectric trench isolation coplanar with said top surface of said upper silicon layer, a bottom surface of said dielectric trench isolation coplanar with said top surface of said buried oxide layer;
  one or more polysilicon dummy gate electrodes in said pre-metal dielectric layer;
  a respective metal silicide layer on a top surface of each dummy gate electrode of said one or more dummy gate electrodes;
  wherein at least one of said first contacts is coplanar with and extends from said top surface of said pre-metal dielectric layer to said metal silicide layer of a corresponding polysilicon dummy gate electrode of said one or more polysilicon dummy gate electrodes, and
  wherein at least one of said second contacts is coplanar with and extends from said bottom surface of said buried oxide layer through said trench isolation, through a gate dielectric layer formed under said polysilicon dummy gate electrode to said polysilicon dummy gate electrode.

27. The structure of claim 26, wherein at least one additional contact of said first contacts extends from said top surface of said pre-metal dielectric layer to said metal silicide layer on a corresponding gate electrode of an additional field effect transistor of said one or more field effect transistors.

28. The structure of claim 26, wherein at least one additional contact of said first contacts extends from said top surface of said pre-metal dielectric layer to said metal silicide layer on a corresponding source/drain of an additional field effect transistor of said one or more field effect transistors.

29. The structure of claim 26, wherein said metal silicide layer comprises platinum silicide, titanium silicide, cobalt silicide or nickel silicide.

30. The structure of claim 26, wherein said electrically conductive metal silicide layers of all source/drains extend from respective top surfaces of said source/drains to respective bottom surfaces of said source/drains and said electrically conductive metal silicide layers of all said gate electrodes extend from respective top surfaces of said gate electrodes to respective bottom surfaces of said gate electrodes.

31. The structure of claim 26, further including:
  a first dielectric passivation on an uppermost wiring level of said first set of wiring levels; and
  a second dielectric passivation on an uppermost wiring level of said second set of wiring levels.

* * * * *